United States Patent
Lee et al.

(10) Patent No.: US 6,829,126 B2
(45) Date of Patent: Dec. 7, 2004

(54) ELECTROSTATIC DISCHARGE PROTECTION CIRCUIT

(75) Inventors: Myoung Goo Lee, Choongcheongbuk-Do (KR); Hong Bae Park, Kyungki-Do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 111 days.

(21) Appl. No.: 10/028,705

(22) Filed: Dec. 28, 2001

(65) Prior Publication Data

US 2002/0085329 A1 Jul. 4, 2002

(30) Foreign Application Priority Data

Dec. 30, 2000 (KR) ........................ 2000-87294

(51) Int. Cl.$^7$ .............................. H02H 3/22; H02H 9/04
(52) U.S. Cl. .......................................... 361/56; 361/111
(58) Field of Search ....................... 361/56, 100, 111; 257/355, 357

(56) References Cited

U.S. PATENT DOCUMENTS

| | | | | |
|---|---|---|---|---|
| 4,795,918 A | * | 1/1989 | Menon et al. | 307/297 |
| 5,814,865 A | * | 9/1998 | Duvvury et al. | 257/360 |
| 5,946,177 A | * | 8/1999 | Miller et al. | 361/56 |
| 6,292,343 B1 | * | 9/2001 | Pequignot et al. | 361/111 |
| 6,399,990 B1 | * | 6/2002 | Brennan et al. | 257/355 |
| 6,437,407 B1 | * | 8/2002 | Ker et al. | 257/357 |
| 6,501,632 B1 | * | 12/2002 | Avery et al. | 361/111 |
| 6,529,359 B1 | * | 3/2003 | Verhaege et al. | 361/100 |

* cited by examiner

Primary Examiner—Brian Sircus
Assistant Examiner—Zeev Kitov
(74) Attorney, Agent, or Firm—Birch, Stewart, Kolasch & Birch, LLP

(57) ABSTRACT

An ESD protection circuit including an NMOS transistor connected between an input/output pad and a ground. The NMOS transistor has a parasitic bipolar transistor, and at least one diode is connected between the input/output pad and the NMOS transistor.

10 Claims, 3 Drawing Sheets

ELECTROSTATIC DISCHARGE PROTECTION CIRCUIT

BACKGROUND OF THE INVENTION

1. Field of the Invention

The present invention relates to an electrostatic discharge protection circuit in a semiconductor integrated circuit.

2. Description of the Related Art

FIG. 1 shows an electrostatic discharge (hereinafter abbreviated "ESD") protection circuit constructed with NMOS transistors according to a related art.

Referring to FIG. 1, a drain of an NMOS transistor N1 is connected to a pad (input or output) 10 and a source is connected to a ground Vss2. A gate is connected to a ground Vss1 when used for an ESD protection circuit or to a pull-down inverter when used for a driving transistor.

The NMOS transistor N1 includes a parasitic bipolar transistor B1. The parasitic bipolar transistor B1 is constructed with a collector/emitter as the drain/source of the NMOS transistor N1 and a base as a substrate of the NMOS transistor N1. In this case, the base is connected to the ground Vss2.

The pad 10 is connected to an internal circuit 12 through a resistance R. Between one end of the resistance R and the ground Vss2, an NMOS transistor N2 is located. The NMOS transistor N2 includes another parasitic bipolar transistor of which the gate and source are connected to each other. In this case, the resistance R reduces an ESD current flowing to the NMOS transistor N2, and the NMOS transistor N2 removes ESD stress still remaining after removal by the NMOS transistor N1.

FIG. 2 shows a layout of an ESD protection circuit in FIG. 1.

Operation of the above-constructed ESD protection circuit of the related art is explained as follows.

Referring to FIG. 2, when ESD stress is applied to the pad, a high voltage is applied to the drain of the NMOS transistor N1. If the high voltage is applied to the drain, holes are discharged to the substrate by junction breakdown between a source region n+ and the substrate p+. In this case, electrons of the source migrate to the drain if the hole current enables a breakdown voltage high enough to overcome a potential barrier of 0.7V between the n+ source region and the p+ substrate. If the potential barrier is overcome, the transistor B1 is turned on, and the required voltage is called a triggering voltage.

The triggering voltage of the NMOS transistor N1 is about 7V in submicrontechnology. Thus, the triggering voltage becomes higher than the breakdown voltage (~5.5V) of a gate insulating layer of the NMOS transistor. This relationship of the triggering voltage exceeding the breakdown voltage causes damage on the gate insulating layer of the NMOS transistor N1 in the related art.

SUMMARY OF THE INVENTION

Accordingly, the present invention is directed to an ESD protection circuit that substantially obviates one or more problems due to limitations and disadvantages of the related art.

An object of the present invention is to provide an ESD protection circuit enabling to increase ESD immunity of semiconductor devices.

To achieve these objects and other advantages and in accordance with the purpose of the invention, as embodied and broadly described herein, an ESD protection circuit includes an NMOS transistor connected between an input/output pad and a ground, the NMOS transistor having a parasitic bipolar transistor, and at least one diode connected between the input/output pad and the NMOS transistor.

In another aspect of the present invention, an ESD protection circuit includes an input/output pad; a plurality of N diodes connected in series between the input/output pad and a substrate of an NMOS transistor wherein the NMOS transistor is connected between the input/output pad and the substrate and has a parasitic bipolar transistor connected to plurality of N the diodes.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Figure 1:
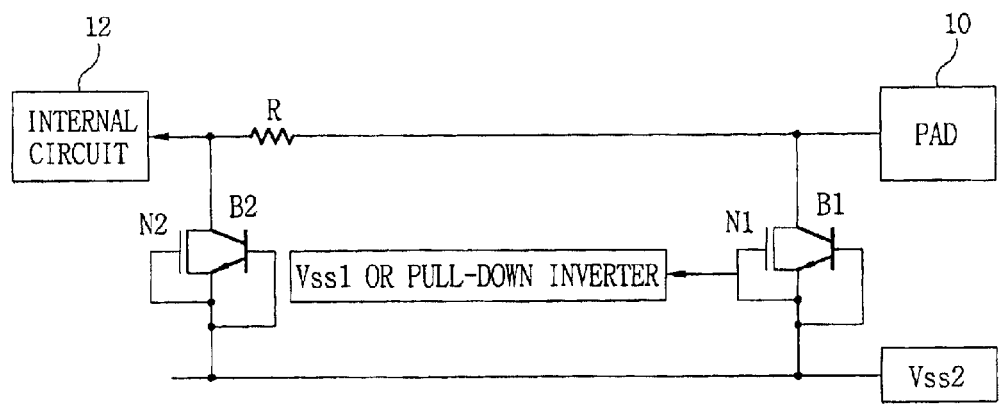
FIG. 1 illustrates an electrostatic discharge protection circuit constructed with NMOS transistors according to a related art.
Figure 2:
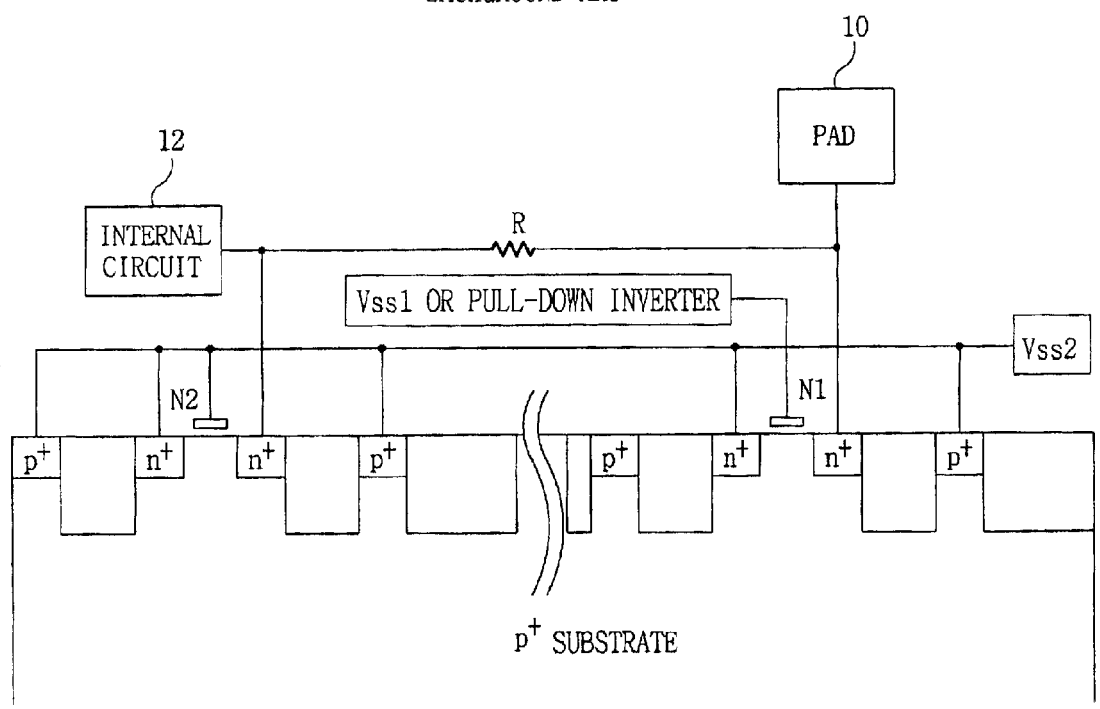
FIG. 2 illustrates a layout of the ESD protection circuit in FIG. 1.
Figure 3:
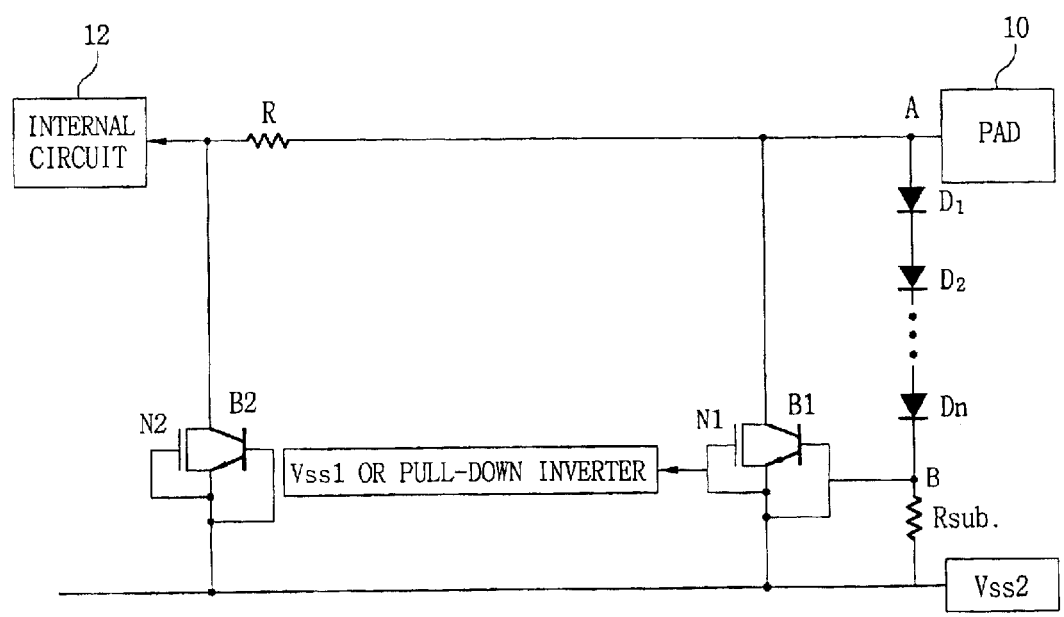
FIG. 3 illustrates an electrostatic discharge protection circuit according to one embodiment of the present invention.

FIG. 3 illustrates an electrostatic discharge ESD protection circuit according to a preferred embodiment of the present invention.

Referring to FIG. 3, in addition to the ESD protection circuit according to the related art, a plurality of diodes D1–Dn are connected between a pad 10 and parasitic bipolar transistor B1. The last diode Dn is connected to a substrate 16 and bipolar transistor B1, as shown in FIG. 4.

Figure 4:
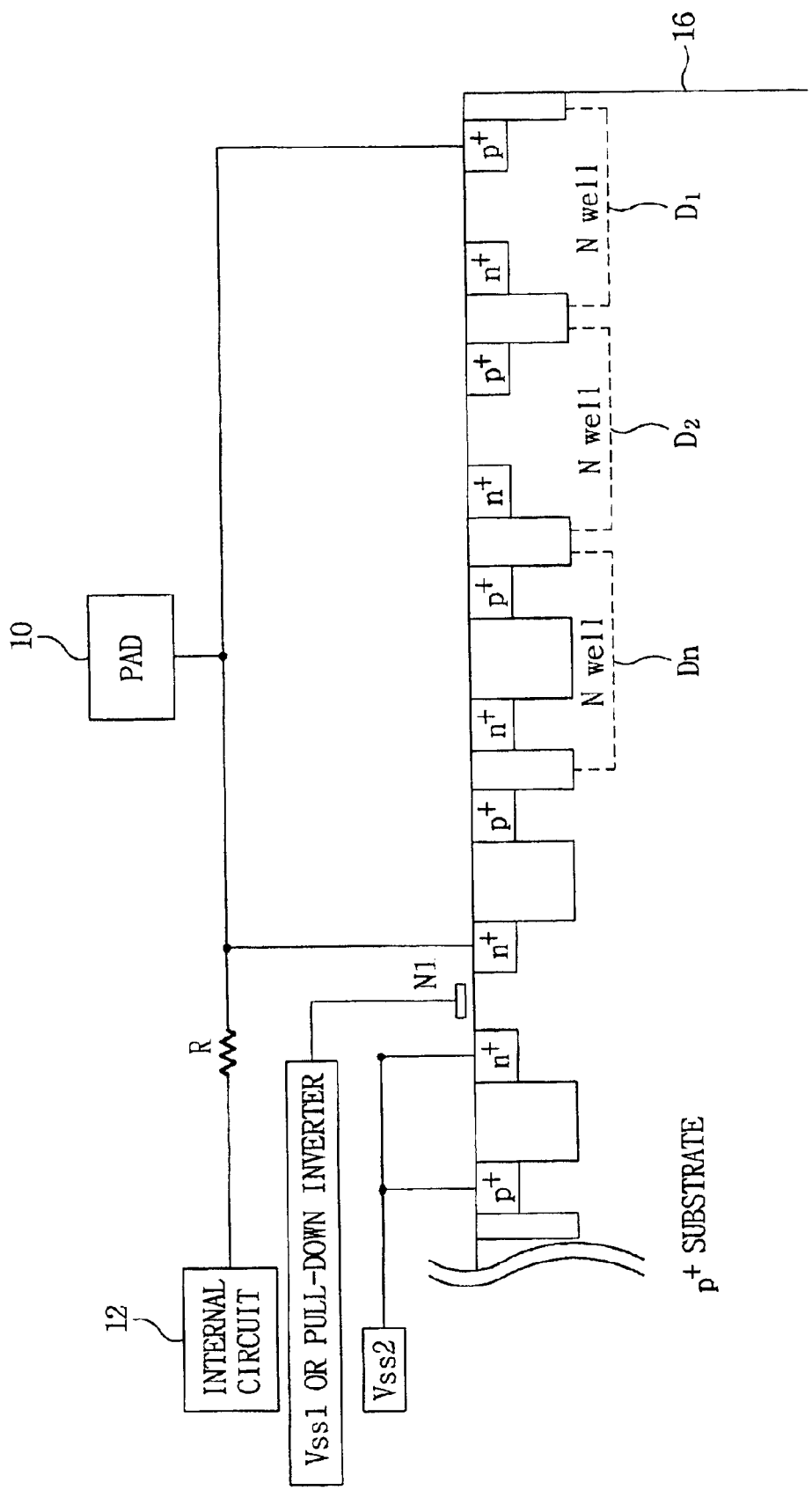
FIG. 4 illustrates a layout of the ESD protection circuit in FIG. 3.

Referring to FIG. 4, a p+ junction of the PN diode D1 is connected to the pad, and an n+ junction of the PN diode D1 is connected to a p+ junction of a second diode D2. Also, an n+ junction of the second diode D2 is connected to a p+ junction of the last diode Dn. The n+ junction of the last diode Dn is connected to a p-type substrate. The number of diodes connected in series is determined so as to stop the current flow through the diodes on normal operation of a chip.

Moreover, an output node of diode Dn is connected to a bulk of the NMOS transistor N1, whereby a potential of the substrate (bulk) of the NMOS transistor N1 is controlled by a forward operation of the diode Dn. In this case, the diode Dn is connected between the pad and ground Vss in forward series.

Although not shown in the figures, the serially-connected diodes may be rearranged to be connected in parallel each other. In this case, the number of diodes utilized is also determined so as to stop the current flow through the diodes on the normal operation of a chip.

As shown in FIG. 3, the drain of the NMOS transistor N1 is connected to the pad 10 (input or output pad), the source is connected to the ground Vss2, and the gate is connected to Vss1 or a pull-down inverter. The parasitic bipolar transistor B1 is connected to the diodes D1–Dn and the ground Vss2. The diodes D1–Dn are connected to the base of the bipolar transistor B1. The bipolar transistor B1 provides a base of the NMOS transistor N1. In this case, 'Rsub,' as shown in FIG. 3, is a substrate resistance.

Operation of the above-constructed ESD protection circuit according to the present invention is explained as follows.

When ESD stress is applied to the pad 10, high voltage is applied to both the drain of the NMOS transistor N1 and the diode D1. In this case, the corresponding diode D1 becomes turned on if the voltage becomes equal to or higher than about 0.7V, which is a built-in voltage of a PN junction, since the diodes are connected to each other in a forward direction. As is well known in the art the built-in voltage of the PN junction may vary.

Yet, as the present diodes are connected in series, a voltage of the node A is dropped down by an amount (number of diodes Dn×0.7V) so as to be applied to the substrate. For instance, if 5 diodes are connected in series to each other, a voltage at a node B becomes the voltage attained by subtracting 3.5V from the voltage at node A. Once the voltage over 3.5V is applied to the pad, all the diodes are turned on so as to increase a potential of the substrate. If the potential of the substrate becomes high, a voltage drop (for example, 0.7V) occurs with ease between the source of the bipolar transistor B1 and substrate. Thus, the triggering voltage of the bipolar transistor B1 is reduced.

As a result, a triggering of the bipolar transistor B1 may occur even at a low voltage. If the bipolar transistor B1 is turned on at the low voltage, a voltage applied to the NMOS transistor N1 and its gate insulating layer is reduced. Thus, the influence or damage to the gate insulating layer of the NMOS transistor N1 is decreased.

Moreover, when measured by applying a voltage to the substrate of the NMOS transistor N1 in the manner of the present invention, a second breakdown current (It2 value) representing ESD performance becomes even higher.

As mentioned in the above description, the present invention improves ESD performance by turning on the parasitic bipolar transistor of the NMOS transistor at a voltage lower than that of the conventional art.

Accordingly, the present invention allows the prevention of a gate insulating layer from receiving a high voltage by turning on a protection circuit at a lower voltage so as to shunt the ESD current as well as improve ESD performance by increasing a magnitude of It2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrostatic discharge (ESD) protection circuit comprising:
    an NMOS transistor connected between an input/output pad and a ground, the NMOS transistor having a parasitic bipolar transistor; and
    at least one diode among a plurality of N diodes, connected between the input/output pad and the NMOS transistor, a cathode of said at least one diode being connected to the ground,
    wherein, p+ and n+ junctions of a first diode of the plurality of N diodes are connected to the input/output pad and a p+ junction of a second diode of the plurality of N diodes, respectively,
    the second diode through the N−1 diode of the plurality of N diodes are connected such that an n+ junction of each of the second diode through the N−1 diode is connected to the p+ junction of a subsequent diode, and
    an n+ junction of an N diode is connected to the substrate.

2. The ESD protection circuit of claim 1, wherein an output terminal of the at least one diode among a plurality of N diodes is connected to a base of the parasitic bipolar transistor.

3. The ESD protection circuit of claim 1, wherein said at least one diode is a PN diode.

4. The ESD protection circuit of claim 1, wherein
    a count of the diodes N of the plurality of N diodes is determined so as to stop a current flow through the at least one diode during a normal operation of a chip.

5. The ESD protection circuit of claim 1, wherein, the plurality of N diodes are connected in series to each other in a forward direction.

6. An electrostatic discharge (ESD) protection circuit comprising:
    an input/output pad;
    a plurality of N diodes connected in series between the input/output pad and a substrate of an NMOS transistor; and
    the NMOS transistor is connected between the input/output pad and has a parasitic bipolar transistor connected to the plurality of N diodes, the cathode of at least one of said plurality of N diodes being connected to a ground,
    wherein p+ and n+ junctions of a first diode of the plurality of N diodes are connected to the input/output pad and a p+ junction of a second diode of the plurality of N diodes, respectively,
    the second diode through the N−1 diodes of the plurality of N diodes are connected such that an n+ junction of each of the second diode through the N−1 diode is connected to the p+ junction of a subsequent diode; and
    an n+ junction of an N diode is connected to the substrate.

7. The ESD protection circuit of claim 6, wherein the substrate is a p-type substrate and connected to said ground.

8. The ESD protection circuit of claim 6, wherein the plurality of N diodes are PN diodes.

9. The ESD protection circuit of claim 6, wherein a number of N diodes in the plurality of N diodes is determined so as to stop a current flow through the plurality of N diodes during a normal operation of a chip.

10. The ESD protection circuit of claim 6, wherein the output terminal from the Nth diode of the plurality of N diodes is connected to the base of the parasitic bipolar transistor.

* * * * *